(12) United States Patent
Buller et al.

(10) Patent No.: US 8,445,309 B2
(45) Date of Patent: May 21, 2013

(54) ANTI-REFLECTIVE PHOTOVOLTAIC MODULE

(75) Inventors: Benyamin Buller, Perrysburg, OH (US); Markus Gloeckler, Perrysburg, OH (US); Yu Yang, Perrysburg, OH (US)

(73) Assignee: First Solar, Inc., Perrysburg, OH (US)

( * ) Notice: Subject to any disclaimer, the term of this patent is extended or adjusted under 35 U.S.C. 154(b) by 0 days.

(21) Appl. No.: 13/214,831

(22) Filed: Aug. 22, 2011

(65) Prior Publication Data

US 2012/0045867 A1    Feb. 23, 2012

Related U.S. Application Data

(60) Provisional application No. 61/375,717, filed on Aug. 20, 2010.

(51) Int. Cl.
*H01L 21/306* (2006.01)

(52) U.S. Cl.
USPC .......................... 438/71; 156/345.54

(58) Field of Classification Search
USPC ............................................. 438/71
See application file for complete search history.

(56) References Cited

U.S. PATENT DOCUMENTS

| | | | |
|---|---|---|---|
| 3,361,594 A | 1/1968 | Iles et al. | |
| 4,086,074 A | 4/1978 | Minot et al. | |
| 4,200,472 A | 4/1980 | Chappell et al. | |
| 4,252,865 A | 2/1981 | Gilbert et al. | |
| 4,451,969 A | 6/1984 | Chaudhuri | |
| 4,557,037 A | 12/1985 | Hanoka et al. | |
| 4,612,698 A | 9/1986 | Gonsiorawski et al. | |
| 5,011,782 A | 4/1991 | Lamb et al. | |
| 5,785,768 A | 7/1998 | Nakata | |
| 5,963,790 A | 10/1999 | Matsuno et al. | |
| 6,538,195 B1 | 3/2003 | Shi et al. | |
| 7,145,721 B2 * | 12/2006 | Banish et al. | 359/569 |
| 7,888,160 B2 | 2/2011 | Shen et al. | |
| 7,964,788 B2 | 6/2011 | den Boer et al. | |
| 7,993,752 B2 | 8/2011 | Appadurai | |
| 2002/0135869 A1 * | 9/2002 | Banish et al. | 359/350 |
| 2008/0210303 A1 | 9/2008 | Lu et al. | |
| 2008/0216893 A1 | 9/2008 | Russell et al. | |
| 2008/0308145 A1 | 12/2008 | Krasnov et al. | |
| 2008/0308146 A1 | 12/2008 | Krasnov et al. | |

(Continued)

FOREIGN PATENT DOCUMENTS

| EP | 2 088 630 A1 | 8/2009 |
|---|---|---|
| EP | 2348546 | 7/2011 |

(Continued)

OTHER PUBLICATIONS

M. J. Minot, "Single-Layer, Gradient Refractive Index Antireflection Films Effective From 0.35 to 2.5 μ," *Journal of the Optical Society of America, American Institute of Physics*, vol. 66, No. 6, pp. 515-519, Jun. 1976.

(Continued)

*Primary Examiner* — Thao P. Le
(74) *Attorney, Agent, or Firm* — Dickstein Shapiro LLP

(57) ABSTRACT

A method of forming an anti-reflective surface for photovoltaic modules. A photovoltaic module including a surface configured to be illuminated is provided. The surface is contacted with an etchant, thereby modifying a portion of the surface to alter the index of refraction.

12 Claims, 4 Drawing Sheets

U.S. PATENT DOCUMENTS

| | | | |
|---|---|---|---|
| 2009/0095346 A1* | 4/2009 | Hurley et al. | 136/256 |
| 2009/0236317 A1* | 9/2009 | Yost et al. | 216/99 |
| 2009/0314343 A1 | 12/2009 | Okaniwa et al. | |
| 2010/0084009 A1 | 4/2010 | Carlson et al. | |
| 2010/0108130 A1 | 5/2010 | Ravi | |
| 2010/0255626 A1 | 10/2010 | Murai et al. | |
| 2010/0259823 A1 | 10/2010 | Xi et al. | |
| 2010/0267187 A1* | 10/2010 | Funakoshi | 438/72 |
| 2010/0300507 A1* | 12/2010 | Heng et al. | 136/244 |
| 2011/0012086 A1 | 1/2011 | Tsakalakos et al. | |
| 2011/0019277 A1 | 1/2011 | Sager et al. | |
| 2011/0023952 A1 | 2/2011 | Williams et al. | |
| 2011/0045627 A1 | 2/2011 | Sachs et al. | |
| 2011/0124145 A1 | 5/2011 | Moslehi | |
| 2011/0132423 A1 | 6/2011 | Joge et al. | |
| 2011/0132444 A1 | 6/2011 | Meier et al. | |
| 2011/0186117 A1 | 8/2011 | Kumar et al. | |
| 2011/0265875 A1* | 11/2011 | Pralle | 136/260 |
| 2012/0178204 A1* | 7/2012 | Toor et al. | 438/71 |

FOREIGN PATENT DOCUMENTS

| | | |
|---|---|---|
| KR | 10-2009-0101396 A | 9/2009 |
| WO | WO-2004/023567 | 3/2004 |
| WO | WO-2010/084290 | 7/2010 |

OTHER PUBLICATIONS

International Preliminary Report and Written Opinion dated Mar. 7, 2013.

* cited by examiner

ANTI-REFLECTIVE PHOTOVOLTAIC MODULE

CLAIM FOR PRIORITY

This application claims priority under 35 U.S.C. §119(e) to Provisional U.S. Patent Application Ser. No. 61/375,717, filed on Aug. 20, 2010, which is hereby incorporated by reference in its entirety.

TECHNICAL FIELD

This invention relates to an anti-reflective photovoltaic module and methods of manufacture.

BACKGROUND

A photovoltaic module can have a glass as a substrate/superstrate. Light passes through the glass and can be absorbed by the semiconductor materials to generate electric power. When the light passes through the glass, about 4% to about 8% of the light will be reflected and can not be utilized to generate electric power.

DETAILED DESCRIPTION

Figure 1:
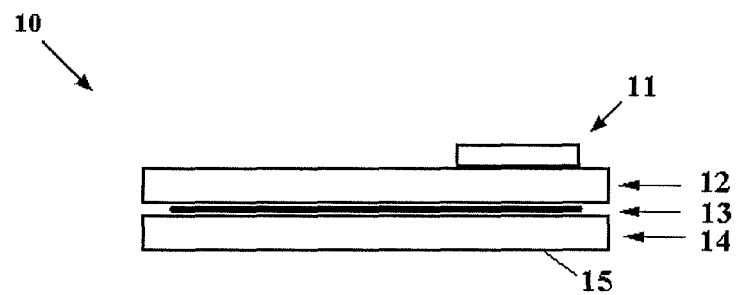
FIG. 1 is a diagram illustrating a photovoltaic module.

Photovoltaic (PV) module converts light to electric power by absorbing light by semiconductor materials. Photovoltaic module has glass as a substrate/superstrate. Light passes through the glass and is absorbed by the semiconductor materials to generate electric power. When the light passes through the glass, about 4% to about 8% of the light will be reflected and can not be utilized to generate electric power. The reflectance of the glass can be reduced by an anti-reflective (AR) surface. Currently major crystalline Si-based PV module manufactures use AR-coated cover glass to reduce the reflectance loss. The AR coating can be a multilayer thin film stack with alternative high refractive index and low refractive index materials, or a single layer of low refractive index (relative to glass n=1.52). Multilayer coating is relatively expensive so not commonly used in the PV industry. Single layer anti-reflective (AR) coating can include $MgF_2$, fluoro-polymers, or porous material.

Even though anti-reflective coating is used in manufacturing cover plates for the crystalline Si modules and thermal collectors, it can be difficult to implement anti-reflective (AR) coating on thin film photovoltaic module. Firstly, thin film photovoltaic module uses transparent conductive oxide (TCO) coated glass as superstrate. It can be technically challenging to coat anti-reflective coating on the other side of the glass (to form structure of AR/glass/TCO) without impacting the TCO. Secondly, with an antireflective coating opposite the TCO, it is not easy for the anti-reflective coating to survive thermal and chemical process steps in the thin film photovoltaic module manufacturing. Thirdly, the most common AR coating process, the sol-gel coating process, cannot be easily implemented on the finished photovoltaic module because the finished module cannot be treated at the high temperatures required in the curing step in anti-reflective coating process (typically about 400° C. to about 700° C.). An anti-reflective coating method and related tool are developed for photovoltaic module, including but not limited to thin film photovoltaic module, manufacturing.

Light energy (photons) incident on a photovoltaic module's surface must enter and be absorbed within the photovoltaic module to be converted to electric energy. The efficiency of the photovoltaic module is directly proportional to the amount of light absorbed by the cell. The surface of the photovoltaic module can be substantially reflective of light energy, reducing the photovoltaic module's efficiency. The reflectance of the glass can be reduced by an anti-reflective coating on cover plate/glass. Porous anti-reflective coating produced by Sol-gel technology is widely used in manufacturing cover plate in the crystalline Si photovoltaic module manufacturing process. The process can include two steps: 1) coat of liquid precursor(s) on the glass surface via dip-coating, roll-coating, spray coating, or slot-die coating; 2) bake/cure at a high temperature. Typically the step 2) is achieved in the glass tempering process at about 700° C. Another technology for making porous anti-reflective coating is acid etching process. The technology is used to manufacture the cover plate for the thermal collector and photovoltaic module.

However, it can be difficult to implement anti-reflective (AR) sol-gel technology on thin film photovoltaic module. It can be technically challenging to coat anti-reflective coating on the other side of TCO glass (to form structure of AR/glass/TCO) without impacting the TCO. With an antireflective coating opposite the TCO, it is not easy for the anti-reflective coating to survive thermal and chemical process steps in the thin film photovoltaic module manufacturing. In addition, it is technically challenging to coat an anti-reflective coating directly on one side of the module without impacting the whole module. Likewise, acid etching process will treat both sides of the glass or photovoltaic module in a traditional acid bath. For example, the acid will attack the TCO layer, or the back plate of the photovoltaic module.

The anti-reflective surface forming method and related tool are developed for photovoltaic module, not limited to thin film photovoltaic module manufacturing. The anti-reflective surface forming method is compatible and implementable to photovoltaic module manufacturing process: 1) the method works on the final product (finished module); 2) etchant etches only the top surface (sunnyside) of the photovoltaic module, without contacting the other layers of the photovoltaic module.

In one aspect, an anti-reflective forming method for photovoltaic module manufacturing can include providing a photovoltaic module including a surface configured to be illuminated. The surface can have a first index of refraction. The method can include contacting the surface with an etchant, thereby modifying a portion of the surface to have a second index of refraction. The second index of refraction can be different from the first index of refraction.

The surface can include glass. The second index of refraction of the portion can be lower than the first index of refraction. Modifying a portion of the surface can include forming a porous anti-reflective surface on a superstrate glass of the photovoltaic module. The method can include transporting the photovoltaic module on a conveyor. The etchant can include hydrogen fluoride. The etchant can include fluorosilicic acid. The method can include cleaning the photovoltaic module after the step of contacting the top surface of the superstrate glass to the etchant. The method can include heating the etchant. The method can include adjusting the position of the surface to control the depth of the second index of refraction into the surface. The method can include electrochemically etching the surface.

In another aspect, an anti-reflective forming tool for modifying a surface property of a photovoltaic module can include a container containing an etchant. The photovoltaic module can include a surface configured to be illuminated. The surface can have a first index of refraction. The tool can include a transport mechanism configured to control exposure of a surface of the photovoltaic module to the etchant.

The tool can include a conveyor for transporting the photovoltaic module. The conveyor can include at least two horizontally positioned rollers, the top surface (sunnyside) of the glass contacting the rollers when the photovoltaic module is transported on the rollers. At least one roller is in the etchant and comprises a material resistant to the etchant. The surface can include glass. The etchant can include a fluorine-containing compound. The etchant can modify a portion of the surface to have a second index of refraction, the second index of refraction being different from the first index of refraction. The second index of refraction of the portion is lower than the first index of refraction. The tool can include a cleaning module configured to clean the photovoltaic module after the photovoltaic module is transported from the etchant. The tool can include a heater configured to maintain the etchant at a predetermined temperature. The tool can include a control module for adjusting the position and transporting speed of the conveyor.

Referring to FIG. 1, finished photovoltaic module 10 can include superstrate glass 14, active layer stack 13, cover glass 12, and cord/wiring plate 11. Active layer stack 13 can include a plurality of semiconductor layers. Superstrate glass 14 can include TCO next to the active layer stack 13. Superstrate glass 14 can have top surface (sunnyside) 15.

Figure 2:
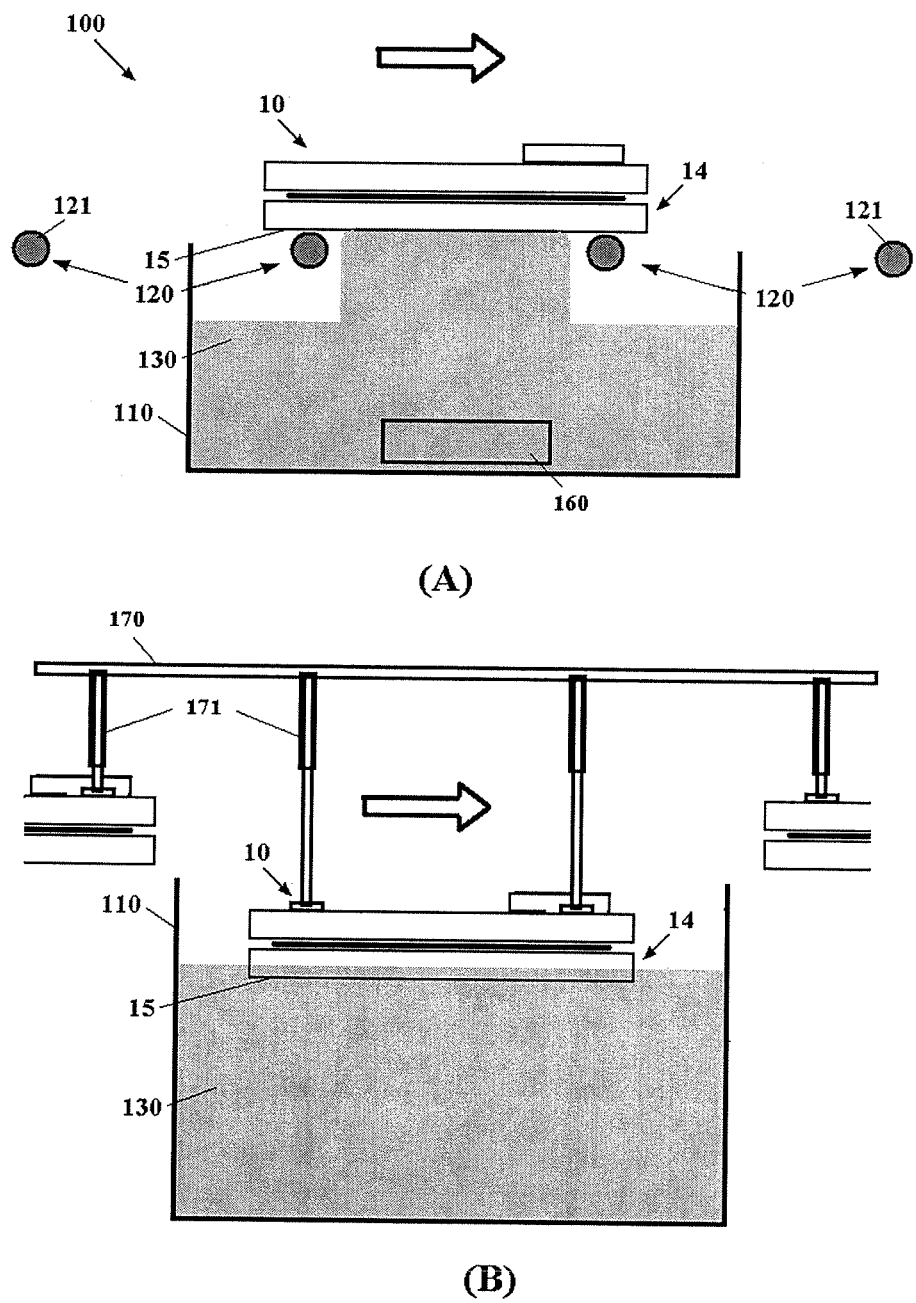
FIG. 2(A) is a diagram illustrating an anti-reflective surface-creating tool.
FIG. 2(B) is a diagram illustrating an anti-reflective surface-creating tool.

Referring to FIG. 2(A), anti-reflective surface forming tool 100 can include container 110 containing etchant 130 and conveyor 120 for transporting photovoltaic module 10. Anti-reflective surface forming tool 100 can include module 160 to lift etchant 130 to an elevated level. Module 160 can include a pump or heating device. Conveyor 120 can be positioned contact a portion of top surface 15 of superstrate glass 14 to etchant 130 to form porous anti-reflective surface (151 in FIG. 3) on superstrate glass 14.

The etchant can include hydrogen fluoride, fluorosilicic acid, or any suitable etching solution. In some embodiments, the etchant can include at least one fluorine-containing compound. In some embodiments, the etchant can include sodium bifluoride, ammonium bifluoride, or other fluorine-containing etchant which can be used for modifying glass surface. In some embodiments, the etchant concentration can be in the range of about 0.5% to about 50%, or about 0.5% to about 5%. In some embodiments, for a hydrogen fluoride etchant, the concentration can be about 5% to about 25% for bifluoride and the etching duration can be in the range between about 10 sec and about 10 min, or about 1 min to about 2 min. Following glass skin removal, anti-reflective etching using fluorosilicic acid or other fluorine-containing acid can be conducted with a concentration of about 5% to about 35%, or about 10% to about 20%, for about 5 min to about 90 min, or about 10 min to about 45 min.

Conveyor 120 can include at least two horizontally positioned rollers 121. Top surface 15 of superstrate glass 14 can contact rollers 121 when photovoltaic module 10 is transported on rollers 121. In some embodiment, at least one roller 121 can be in etchant 130 and roller 121 can be made of a material resistant to corrosion caused by etchant 130.

Superstrate glass 14 can include glass. Etchant 130 can include any suitable solution or etchant capable of modifying the index of refraction of the surface of the glass, for example, by introducing porosity. Etchant 130 can be an etching solution which can optionally include a fluorine-containing compound. Etchant 130 can include hydrogen fluoride. In certain embodiments, the etching solution 130 can include fluorosilicic acid.

Referring to FIG. 2(B), conveyor 170 can include at least two expandable arms 171 to hold photovoltaic module 10 facing down. Expandable arms 171 can be expanded to immerse top surface 15 of superstrate glass 14 into etching solution 130 to form porous anti-reflective surface (151 in FIG. 3) on superstrate glass 14.

As shown in FIGS. 2(A) and 2(B), among the plurality of layers of photovoltaic module 10, only a portion of superstrate glass 14 is immersed into etchant 130. Therefore, none of the other layers of photovoltaic module 10 is affected by etchant 130 to prevent any unwanted reaction between the layers and the etchant. Tool 100 can include a cleaning module (not shown) for cleaning photovoltaic module 10 after photovoltaic module 10 is transported from etchant 130. Tool 100 can include a heater (not shown) for maintaining etchant 130 at a predetermined temperature, for example, to control the change in index of refraction in the surface. The etchant can be agitated or circulated. Tool 100 can include a control module (not shown) for adjusting the position and transporting speed of conveyor 120.

Figure 3:
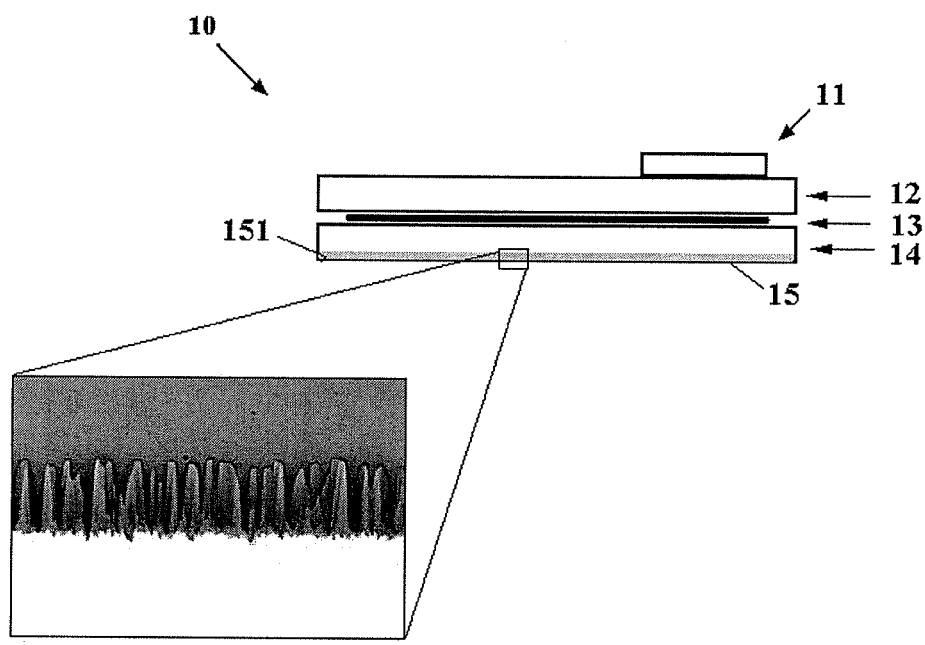
FIG. 3 is a diagram illustrating a photovoltaic module having an anti-reflective surface.

Referring to FIG. 3, after exposure to the etchant bath, photovoltaic module 10 can include anti-reflective layer 151 on superstrate glass 14. Anti-reflective layer 151 can increase the proportion of incoming light being absorbed by active layer stack 13, thereby increasing the efficiency of photovoltaic module 10. Anti-reflective (AR) layer 151 replaces the air-glass interface with two interfaces: an air-AR interface and an AR-glass interface. Because the anti-reflective layer has an index of refraction between that of glass and that of air, each of these interfaces exhibits less reflection than the air-glass interface does and in fact the total of the two reflections is less than that of the native air-glass interface. In some embodiments, the refractive index of the AR layer can be in the range of about 1.18 to about 1.38. In one embodiment the refractive index can be about 1.23.

Anti-reflective layer 151 can be a porous thin layer on the surface of the photovoltaic device. When cover plate 14 is made of glass, anti-reflective surface 151 can be a porous glass film. Anti-reflective layer 151 can have any suitable thickness for light-passing efficiency, such as from about 80 nm to about 200 nm; from about 100 nm to about 200 nm; from about 150 nm to about 200 nm; from about 80 nm to about 100 nm; from about 80 nm to about 150 nm. In one embodiment the thickness is from about 100 nm to about 130 nm.

As shown in the magnified portion of FIG. 3, porous glass anti-reflective layer 151 can be a glass film that includes pores in the nm- or μm-range. The size of pores can be in the range of about 5 to about 50 nm. In some embodiments, the size of pores can be in the range of about 10 to about 25 nm, in diameter. In some embodiments, porous glass film can be a porous film containing approximately 96% silica, which is produced by an acidic extraction or a combined acidic and alkaline extraction and features a three-dimensional interconnected porous microstructure. In some embodiments, such a porous glass anti-reflective surface can increase light transmission by up to about 5% to about 7% where both sides are etched, or about 2% to about 3% where a single side is etched, and can lead to a corresponding efficiency increase in light to current conversion by the photovoltaic module.

In some embodiments, an electrochemical etching technique can be used to provide continuous control over the porosity of a porous glass layer as a function of etching depth. Thin films with engineered porosity gradients, and thus a controllable gradient in the index of refraction, can be generated to achieve broadband antireflection properties on cover glass and high efficiency of photovoltaic modules.

Figure 4:
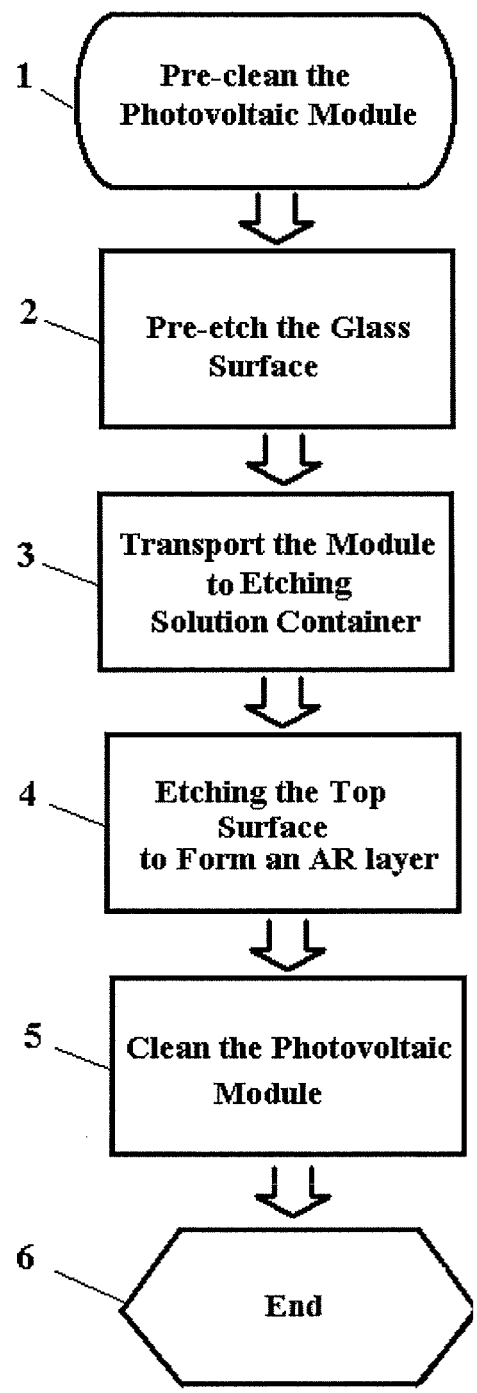
FIG. 4 is a flow chart illustrating an operation process of an anti-reflective surface-creating tool.

Referring to FIG. 4, anti-reflective forming process can include: step (1) optional pre-clean the photovoltaic module; step (2 pre-etch the glass surface to remove the glass skin layer followed by deionized (DI) water rinse; step (3) transporting the module to etchant container; step (4) etching the top surface to form an anti-reflective surface on the sunnyside of the glass of photovoltaic module; step (5) cleaning the photovoltaic module to remove etchant and byproducts; and step (6) ending the surface process and transporting the device to the following manufacturing process. Anti-reflective surface process can further include measuring the optical property of the anti-reflective surface, measuring the thickness of the anti-reflective surface, estimating the device performance, and determining if adjustments need to be made to etching process.

In some embodiments, anti-reflective forming process can include an electrochemically etching process. The process can be an electroetching process that involves the use of a solution of an electrolyte, an anode and a cathode. In order to reduce unwanted electro-chemical effects, the anode and the cathode should be of the same metal. Depending on the voltage used and the concentration of the electrolyte, other, more complex electrochemical effects can take place at the anode and the cathode but the solution at the anode and deposition at the cathode are the main effects.

A number of embodiments of the invention have been described. Nevertheless, it will be understood that various modifications may be made without departing from the spirit and scope of the invention. It should also be understood that the appended drawings are not necessarily to scale, presenting a somewhat simplified representation of various preferred features illustrative of the basic principles of the invention.

What is claimed is:

1. An anti-reflective forming method for photovoltaic module manufacturing comprising:

providing a photovoltaic module including a surface comprising silica, the surface configured to be illuminated and having a first index of refraction; and contacting the surface with an etchant, thereby modifying a contacted portion of the surface to have a second index of refraction, the second index of refraction being different from the first index of refraction.

2. The method of claim 1, wherein the surface comprises glass.

3. The method of claim 1, wherein the second index of refraction of the portion is lower than the first index of refraction.

4. The method of claim 1, wherein modifying a portion of the surface comprises forming a porous anti-reflective surface on a superstrate glass of the photovoltaic module.

5. The method of claim 1, further comprising transporting the photovoltaic module on a conveyor.

6. The method of claim 1, wherein the etchant comprises hydrogen fluoride.

7. The method of claim 1, wherein the etchant comprises fluorosilicic acid.

8. The method of claim 1 further comprising cleaning the photovoltaic module after the step of contacting the surface to the etchant.

9. The method of claim 1 further comprising heating the etchant.

10. The method of claim 1 further comprising adjusting the position of the surface to control the depth of the second index of refraction into the surface.

11. The method of claim 1 further comprising electrochemically etching the surface.

12. The method of claim 1, wherein the surface is coated with a transparent conductive oxide material.

* * * * *